United States Patent
Kawashima et al.

(10) Patent No.: US 8,737,447 B2
(45) Date of Patent: May 27, 2014

(54) NITRIDE SEMICONDUCTOR LASER

(75) Inventors: Shoichi Kawashima, Kawasaki (JP); Yasuhiro Nagatomo, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 516 days.

(21) Appl. No.: 12/731,837

(22) Filed: Mar. 25, 2010

(65) Prior Publication Data

US 2010/0246625 A1 Sep. 30, 2010

(30) Foreign Application Priority Data

Mar. 27, 2009 (JP) .................... 2009-079399

(51) Int. Cl.
*H01S 3/08* (2006.01)

(52) U.S. Cl.
USPC ...... 372/99; 372/50.124; 372/102; 372/50.11

(58) Field of Classification Search
USPC .............. 372/50.124, 99, 102, 50.11
See application file for complete search history.

(56) References Cited

U.S. PATENT DOCUMENTS

| | | | |
|---|---|---|---|
| 6,711,200 B1 * | 3/2004 | Scherer et al. | 372/64 |
| 2007/0280318 A1 * | 12/2007 | Yoshimoto et al. | 372/43.01 |

FOREIGN PATENT DOCUMENTS

| | | |
|---|---|---|
| JP | 2006-165255 A | 6/2006 |
| JP | 20070234835 A | 9/2007 |
| JP | 20080135441 A | 6/2008 |
| WO | 2003/085790 A | 10/2003 |

* cited by examiner

*Primary Examiner* — Tod T Van Roy
(74) *Attorney, Agent, or Firm* — Canon USA, Inc. IP Division

(57) ABSTRACT

A nitride semiconductor surface-emitting laser includes a two-dimensional photonic crystal layer having a resonant mode in an in-plane direction. The surface-emitting laser includes an active layer, the two-dimensional photonic crystal layer, a semiconductor layer, and an electrode in this order. The two-dimensional photonic crystal layer contains p-type conductive $In_xGa_{1-x}N$ ($0 \leq x \leq 1$) as a high-refractive-index medium. The semiconductor layer contains p-type conductive $In_yGa_{1-y}N$ ($0 \leq y \leq 1$). The thickness $t_{PhC}$ of the two-dimensional photonic crystal layer satisfies the relation of $t_{PhC} \geq (\lambda/n_{\it eff})$, wherein $\lambda$ denotes the lasing wavelength, and $n_{\it eff}$ denotes the effective refractive index of the resonant mode.

4 Claims, 6 Drawing Sheets

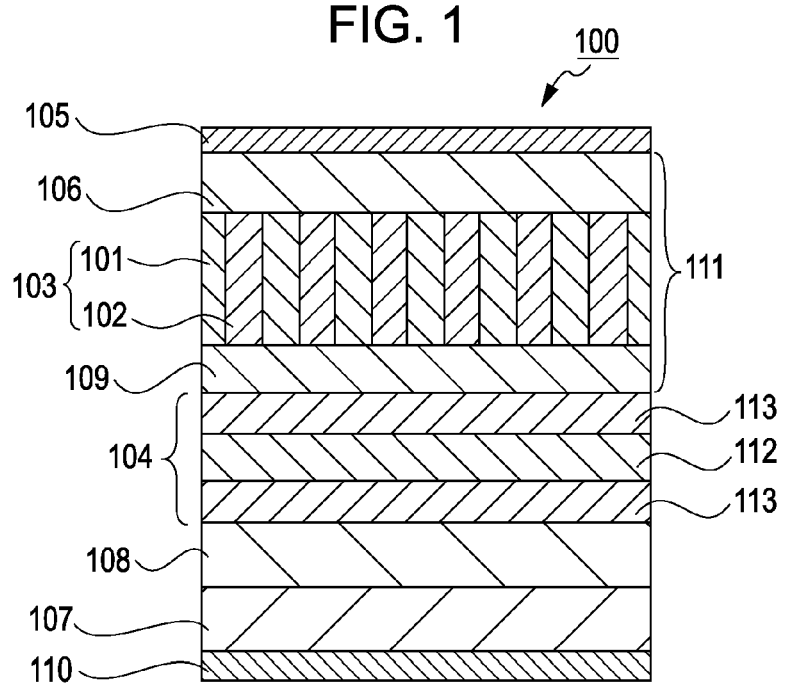
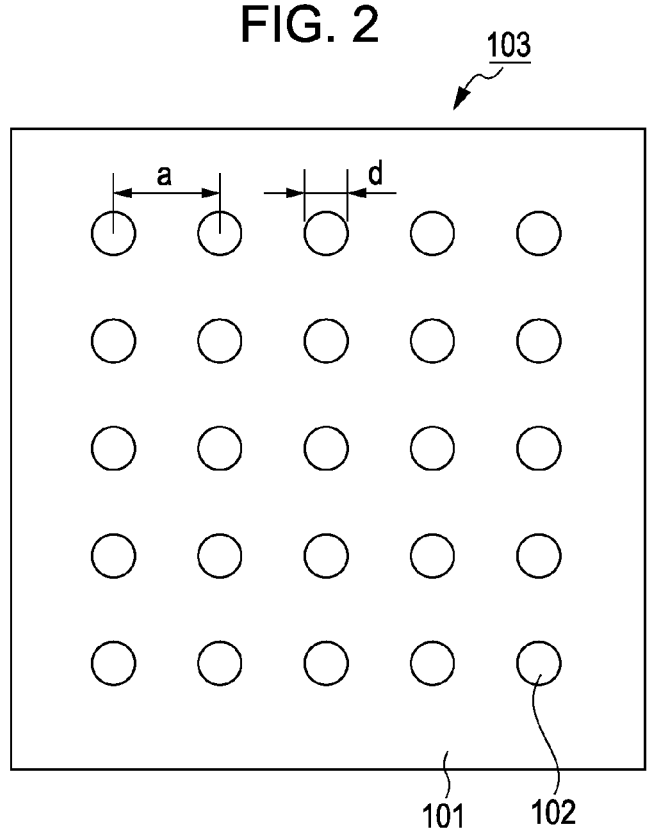

NITRIDE SEMICONDUCTOR LASER

BACKGROUND OF THE INVENTION

1. Field of the Invention

The present invention relates to a nitride semiconductor laser.

2. Description of the Related Art

A surface-emitting laser, which is one type of semiconductor laser, is characterized by emitting light in a direction perpendicular to a substrate. A vertical-cavity surface-emitting laser, which includes an active layer between distributed Bragg reflectors, is practically used at infrared wavelengths. However, in a GaN-based vertical-cavity surface-emitting laser having a lasing wavelength in the ultraviolet to green wavelength region, it is difficult to manufacture distributed Bragg reflectors due to the physical properties of nitride semiconductors. In particular, it is very difficult to develop a vertical-cavity surface-emitting laser capable of current injection in the wavelength region. Thus, a distributed feedback (DFB) surface-emitting laser containing two-dimensional photonic crystals has recently been investigated. The distributed feedback surface-emitting laser containing two-dimensional photonic crystals is hereinafter referred to as a DFB surface-emitting laser.

Two-dimensional photonic crystals of a DFB surface-emitting laser function as a second-order diffraction grating for the lasing wavelength. Thus, a feedback effect (in particular, an amplification effect in a gain region) can be achieved as second-order diffraction, and a laser beam is emitted in a direction perpendicular to a substrate by a first-order diffraction.

FIG. 7 is a cross-sectional view of a DFB surface-emitting laser 1100 according to Japanese Patent Laid-Open No. 2006-165255 (FIG. 2, paragraph [0034]).

The DFB surface-emitting laser 1100 includes an n-type cladding layer 1108, an active layer 1104, and a p-type conductive layer 1111 on an n-type substrate 1107 in this order. The active layer 1104 includes a well sublayer 1112 and barrier sublayers 1113. The p-type conductive layer 1111 includes a minority carrier blocking sublayer 1109, a two-dimensional photonic crystal sublayer 1101, a p-type cladding sublayer 1102, and a semiconductor sublayer 1103. The DFB surface-emitting laser 1100 further includes a p-electrode 1105 and an n-electrode 1110 at the top and bottom thereof.

In the surface-emitting laser 1100, the two-dimensional photonic crystal sublayer 1101 is composed of a high-refractive-index medium 1001 and a low-refractive-index medium 1002. The high-refractive-index medium 1001 is p-type GaN and has a thickness of 100 nm.

The p-type cladding sublayer 1102 is formed of p-type AlGaN and has a thickness of 500 nm. The thickness of the p-type cladding sublayer 1102 is determined such that light produced in the well sublayer 1112 is attenuated in the p-type cladding sublayer 1102 to such an extent that the optical absorption loss in the p-electrode 1105 is sufficiently small. It is therefore desirable that the p-type cladding sublayer 1102 have a sufficient thickness with respect to optical confinement.

As described in Japanese Patent Laid-Open No. 2006-165255, in a nitride semiconductor laser having a separate-confinement heterostructure, p-type AlGaN is generally used as a material of a p-side cladding layer.

However, because the p-type nitride semiconductor has an optical absorption loss resulting from a Mg dopant, it is desirable that the thickness of the p-type conductive layer be reduced. In particular, since p-type AlGaN has a higher electrical resistance than the same p-type conductive, p-type GaN, a further improvement is required to decrease the lasing threshold.

In order to decrease the lasing threshold, the thickness of a p-type AlGaN layer may be decreased, or the Al content in a p-type AlGaN layer may be decreased to reduce the resistivity of the p-type AlGaN layer.

However, a p-type AlGaN layer having a small thickness has an insufficient function as a cladding layer and cannot provide a sufficient thickness to reduce light leakage to the p-electrode. This results in a large optical absorption loss in the p-electrode, leading to poor laser performance.

A decrease in Al content in a p-type AlGaN layer to reduce the resistivity of the p-type AlGaN layer results in an increase in the refractive index of the AlGaN layer, thereby increasing light leakage toward the p-electrode. This also results in an increase in optical absorption loss in the p-electrode, leading to poor laser performance.

SUMMARY OF THE INVENTION

The present invention provides a nitride semiconductor laser that has a small optical absorption loss in a p-electrode, without using high-resistance p-type AlGaN in a cladding layer.

A surface-emitting laser according to one aspect of the present invention is a nitride semiconductor surface-emitting laser that includes a two-dimensional photonic crystal layer having a resonant mode in an in-plane direction. The surface-emitting laser includes an active layer, the two-dimensional photonic crystal layer, a semiconductor layer, and an electrode in this order. The two-dimensional photonic crystal layer contains p-type conductive $In_xGa_{1-x}N$ ($0 \leq x \leq 1$) as a high-refractive-index medium. The semiconductor layer contains p-type conductive $In_yGa_{1-y}N$ ($0 \leq y \leq 1$). The thickness $t_{PhC}$ of the two-dimensional photonic crystal layer satisfies the relation of $t_{PhC} \geq (\lambda/n_{eff})$, wherein $\lambda$ denotes the lasing wavelength, and $n_{eff}$ denotes the effective refractive index of the resonant mode. No p-type conductive AlGaN layer is disposed between the two-dimensional photonic crystal layer and the semiconductor layer.

An edge-emitting laser according to another aspect of the present invention is a nitride semiconductor edge-emitting laser. The edge-emitting laser includes an active layer, a low-refractive-index-medium-embedded layer, a semiconductor layer, and an electrode in this order. The low-refractive-index-medium-embedded layer contains a medium having a lower refractive index than a surrounding medium. The surrounding medium of the low-refractive-index-medium-embedded layer is p-type conductive $In_xGa_{1-x}N$ ($0 \leq x \leq 1$). The semiconductor layer contains p-type conductive $In_yGa_{1-y}N$ ($0 \leq y \leq 1$).

No p-type conductive AlGaN layer is disposed between the low-refractive-index-medium-embedded layer and the semiconductor layer.

The present invention can provide a nitride semiconductor laser that has a small optical absorption loss in a p-electrode, without using high-resistance p-type AlGaN in a cladding layer.

Further features of the present invention will become apparent from the following description of exemplary embodiments (with reference to the attached drawings).

BRIEF DESCRIPTION OF THE DRAWINGS

FIG. 1 is a cross-sectional view of a DFB surface-emitting laser formed of a nitride semiconductor according to an embodiment of the present invention.

FIG. 2 is a top view of a two-dimensional photonic crystal sublayer of the surface-emitting laser illustrated in FIG. 1.

DESCRIPTION OF THE EMBODIMENTS

First Embodiment

Figure 3:
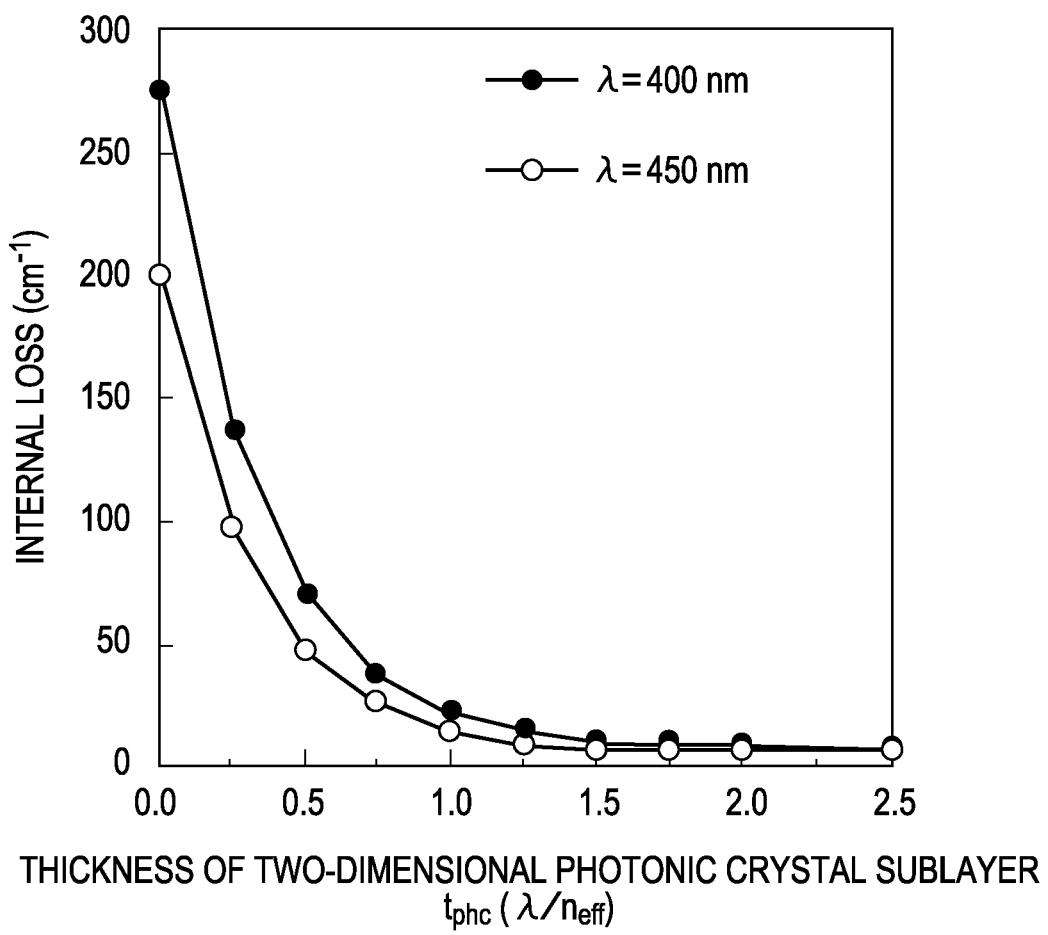
FIG. 3 is a graph showing the relationship between the internal loss and the thickness $t_{PhC}$ of a two-dimensional photonic crystal sublayer according to an embodiment of the present invention.

FIG. 1 is a cross-sectional view of a DFB surface-emitting laser formed of a nitride semiconductor according to a first embodiment of the present invention.

A surface-emitting laser 100 according to the present embodiment includes an n-type cladding layer 108 and an active layer 104 in this order on an n-type substrate 107. The active layer 104 includes a well sublayer 112 and a barrier sublayer 113. The surface-emitting laser 100 further includes a p-type conductive layer 111 on the active layer 104. The p-type conductive layer 111 includes a two-dimensional photonic crystal sublayer 103 and a semiconductor sublayer 106. The surface-emitting laser 100 further includes a p-electrode 105 and an n-electrode 110 at the top and bottom thereof. The p-type conductive layer 111 may further include a minority carrier blocking sublayer 109.

Electrons injected from the n-electrode 110 and positive holes injected from the p-electrode 105 are recombined together in the well sublayer 112, producing light having energy corresponding to the band gap of the well sublayer 112.

The minority carrier blocking sublayer 109 between the two-dimensional photonic crystal sublayer 103 and the active layer 104 prevents part of injected electrons from escaping from the recombination in the well sublayer 112 and flowing into the two-dimensional photonic crystal sublayer 103. The minority carrier blocking sublayer 109 has a wider band gap than the barrier sublayer 113.

Light produced in the well sublayer 112 is distributed from the n-type cladding layer 108 to the two-dimensional photonic crystal sublayer 103. This is because the refractive index of the n-type cladding layer 108 and the average refractive index of the two-dimensional photonic crystal sublayer 103 are lower than the refractive index of the active layer 104 (a separate-confinement heterostructure). The light intensity distribution in the cross-sectional direction of the surface-emitting laser 100 has the maximum in the vicinity of the active layer 104 and is attenuated toward the n-type cladding layer 108 and the two-dimensional photonic crystal sublayer 103. Light distributed in the two-dimensional photonic crystal sublayer 103 is diffracted in the first order and is emitted in a direction perpendicular to the substrate while receiving a feedback effect (second-order diffraction) from photonic crystals in the in-plane direction of the substrate.

Basic Structure of Two-Dimensional Photonic Crystal Sublayer

The two-dimensional photonic crystal sublayer 103 is formed of a high-refractive-index medium 101 and a low-refractive-index medium 102 arranged regularly in the in-plane direction and has a resonant mode in the in-plane direction. The resonance intensity (diffraction intensity) in the in-plane direction increases with increasing difference in refractive index between the high-refractive-index medium 101 and the low-refractive-index medium 102. The high-refractive-index medium 101 is p-type conductive $In_xGa_{1-x}N$ ($0 \leq x \leq 1$). The low-refractive-index medium 102 has a lower refractive index than the high-refractive-index medium 101 and is air or $SiO_2$, for example.

It is desirable that the In content in $In_xGa_{1-x}N$ ($0 \leq x \leq 1$) be determined such that light produced in the well sublayer 112 is not absorbed by the high-refractive-index medium 101. For example, the In content is determined such that the band gap of the high-refractive-index medium 101 is at least 5% larger than the band gap of the well sublayer 112.

FIG. 2 is a top view of the two-dimensional photonic crystal sublayer 103 of the surface-emitting laser illustrated in FIG. 1. The two-dimensional photonic crystal sublayer 103 includes cylinders of the low-refractive-index medium 102 arranged in a tetragonal lattice in the matrix of the high-refractive-index medium 101. The lasing wavelength of the surface-emitting laser 100 depends on the interval a of the low-refractive-index medium 102. More specifically, the interval a is determined by the wavelength λ in a vacuum of the resonant mode of the two-dimensional photonic crystal sublayer 103 and the effective refractive index $n_{eff}$ of the resonant mode and satisfies the relation of $a=\lambda/n_{eff}$. For example, for a high-refractive-index medium 101 of GaN and a low-refractive-index medium 102 of air, when the interval a is 160 nm, light having a wavelength of approximately 400 nm can be diffracted in a direction perpendicular to the substrate. The magnitude of the diffraction effect of the two-dimensional photonic crystals depends on the area percentage ff of the low-refractive-index medium 102. The area percentage ff in the two-dimensional photonic crystal sublayer 103 illustrated in FIG. 2 is expressed by the following equation 1.

$$ff = \pi \times (d/2)^2 \qquad \text{Equation 1}$$

In the equation 1, d denotes the diameter of the cylinders of the low-refractive-index medium. In order to effectively perform second-order diffraction, the diameter d is set to satisfy $0.05 \leq ff \leq 0.2$ or $0.4 \leq ff \leq 0.8$. In order to effectively perform first-order diffraction, the diameter d is set to satisfy $0.2 \leq ff \leq 0.4$. The area percentage ff of the low-refractive-index medium 102 is also correlated with the average refractive index of the two-dimensional photonic crystal sublayer 103. The area percentage ff therefore determines the light intensity distribution in the cross-sectional direction of the surface-emitting laser 100.

The two-dimensional photonic crystal sublayer 103 may have a multilayer structure composed of a plurality of media.

Although the cylinders of the low-refractive-index medium 102 are arranged in a tetragonal lattice in the two-dimensional photonic crystal sublayer 103 illustrated in FIG. 2, the cylinders may be arranged in a triangular lattice, a simple rectangular lattice, a face-centered rectangular lattice, or an orthorhombic lattice. In this case, the interval a (the length of a primitive translation vector) of photonic crystals is appropriately determined in a manner that depends on the wavelength at which light oscillates. The shape of the low-refractive-index medium 102 may be a quadrangular prism.

Thickness of Two-Dimensional Photonic Crystal Sublayer: Lower Limit

The thickness $t_{PhC}$ of the two-dimensional photonic crystal sublayer 103 satisfies the relation of $t_{PhC} \geq (\lambda/n_{eff})$, wherein $\lambda$ denotes the lasing wavelength, and $n_{eff}$ denotes the effective refractive index of the resonant mode. In other words, the thickness $t_{PhC}$ of the two-dimensional photonic crystal sublayer 103 is $t_{PhC} \geq (\lambda/n_{eff})$.

The thickness of the two-dimensional photonic crystal sublayer 103 that satisfies the relation is larger than the thickness of the two-dimensional photonic crystal sublayer according to Japanese Patent Laid-Open No. 2006-165255. Since the two-dimensional photonic crystal sublayer 103 has a lower average refractive index than the active layer 104, the two-dimensional photonic crystal sublayer 103 itself functions as a cladding layer. Light produced in the well sublayer 112 is therefore attenuated in the two-dimensional photonic crystal sublayer 103 having a low average refractive index and a large thickness. This can decrease the percentage of light leaking to the p-electrode 105 and decrease the absorption loss in the p-electrode 105.

This can obviate the need for a p-type AlGaN layer used as a conventional cladding layer, thus decreasing electrical resistance.

The minimum thickness of the two-dimensional photonic crystal sublayer 103 is determined by evaluating the absorption loss in the p-electrode 105. With respect to absorption loss, internal loss is considered. Internal loss takes account of absorption loss not only in the p-electrode 105, but also in the p-type conductive layer 111. Thus, the internal loss is the sum of the absorption loss in the p-electrode 105 and the absorption loss in the p-type conductive layer 111.

The absorption loss in the p-type conductive layer 111 depends on the dopant Mg concentration. In the present embodiment and examples and comparative examples described below, the internal loss is evaluated on the assumption that the Mg concentration of the p-type conductive layer 111 is approximately $3 \times 10^{19}$ cm$^{-1}$ and that the absorption coefficient of the p-type conductive layer 111 is 60 cm$^{-1}$ at a wavelength of 400 nm.

FIG. 3 shows the relationship between the internal loss and the thickness $t_{PhC}$ of a two-dimensional photonic crystal sublayer 103. The thickness $t_{PhC}$ is standardize by the lasing wavelength $\lambda$ and the effective refractive index $n_{eff}$ of the resonant mode. Thus, the effects of refractive index dispersion can be taken into consideration.

In FIG. 3, the result for the lasing wavelength $\lambda$ of 400 nm was obtained with a structure according to Example 1 described below as a function of the thickness of the two-dimensional photonic crystal sublayer 103. The result for the lasing wavelength $\lambda$ of 450 nm was obtained with a structure according to Example 3.

FIG. 3 shows that the internal loss almost levels off at a thickness $t_{PhC}$ of the two-dimensional photonic crystal sublayer 103 of $\lambda/n_{eff}$ (one wavelength in the laser) or more. When the thickness $t_{PhC}$ is excessively small, light produced in the well sublayer 112 cannot be sufficiently attenuated in the two-dimensional photonic crystal sublayer 103. This increases absorption loss in the p-electrode 105 and increases the internal loss.

Even in consideration of an internal loss of 30 cm$^{-1}$ or less in an edge-emitting nitride semiconductor laser, the minimum thickness of the two-dimensional photonic crystal sublayer 103 in the present embodiment can be $t_{PhC} \geq (\lambda/n_{eff})$.

The two-dimensional photonic crystal sublayer 1101 of the surface-emitting laser 1100 according to Japanese Patent Laid-Open No. 2006-165255 has a thickness below $\lambda/n_{eff}$.

Thickness of Two-Dimensional Photonic Crystal Sublayer: Upper Limit

Figure 7:
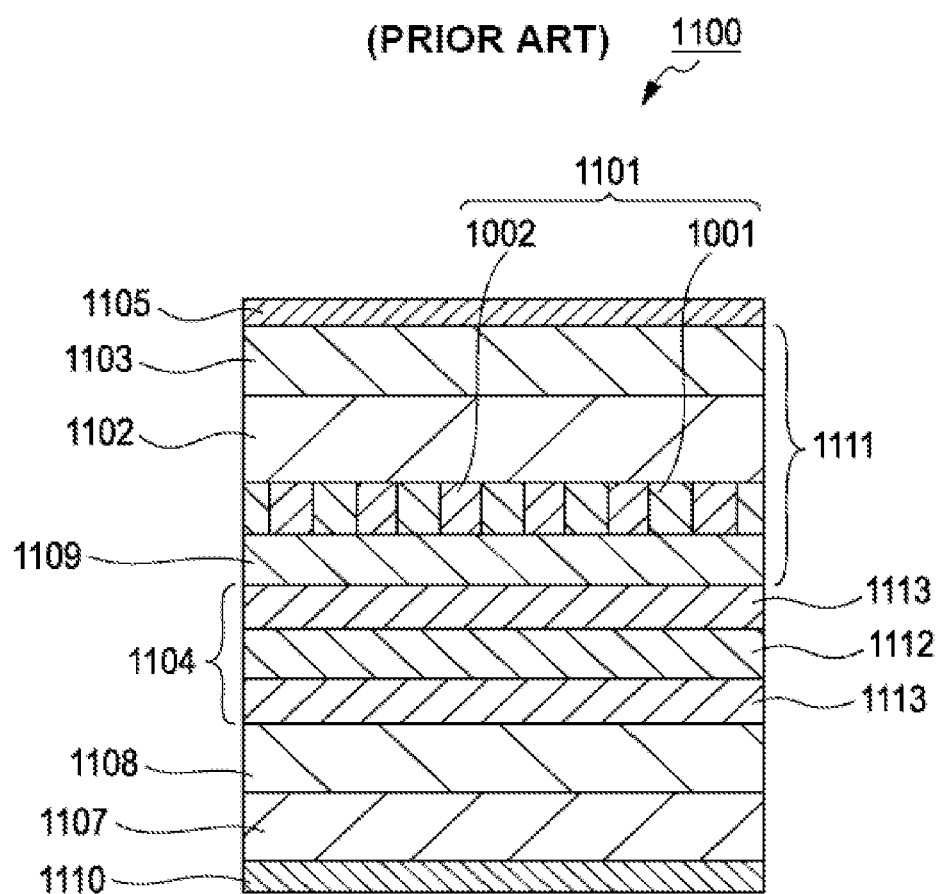
FIG. 7 is a cross-sectional view of a DFB surface-emitting laser formed of a nitride semiconductor according to Japanese Patent Laid-Open No. 2006-165255 (FIG. 2).

It is desirable that the thickness $t_{PhC}$ of the two-dimensional photonic crystal sublayer satisfy $t_{PhC} \leq 3.5 \times (\lambda/n_{eff})$. The maximum thickness of the two-dimensional photonic crystal sublayer can be determined on the basis of two points: a comparison of electrical resistance in the surface-emitting laser 100 illustrated in FIG. 1 and the surface-emitting laser 1100 illustrated in FIG. 7, and the difficulty with which the low-refractive-index medium 102 is formed. These two points are individually described below.

In the surface-emitting laser 100 according to the present embodiment, the two-dimensional photonic crystal sublayer 1101, the p-type cladding sublayer 1102, and the semiconductor sublayer 1103 of the surface-emitting laser 1100 according to Japanese Patent Laid-Open No. 2006-165255 are replaced with the two-dimensional photonic crystal sublayer 103 and the semiconductor sublayer 106.

The electrical resistance $R_{100}$ per unit area of the two-dimensional photonic crystal sublayer 103 and the semiconductor sublayer 106 of the surface-emitting laser 100 according to the present embodiment is expressed by the following equation 2.

$$R_{100} = \rho_{101} \times (t_{103}/(1-ff))\rho_{106} \times t_{106} \qquad \text{Equation 2}$$

In the equation 2, $\rho_{101}$ denotes the resistivity of the high-refractive-index medium 101 of the two-dimensional photonic crystal sublayer 103, $t_{103}$ denotes the thickness of the two-dimensional photonic crystal sublayer 103, ff denotes the area percentage of the low-refractive-index medium 102 in the two-dimensional photonic crystal sublayer 103, $\rho_{106}$ denotes the resistivity of the semiconductor sublayer 106, and $t_{106}$ denotes the thickness of the semiconductor sublayer 106. The equation 2 is based on the assumption that the low-refractive-index medium 102 is an insulating material. In the case that the low-refractive-index medium 102 is an electroconductive medium, a term of the partial resistivity of the low-refractive-index medium 102 is added to the equation 2.

The electrical resistance $R_{1100}$ per unit area of the two-dimensional photonic crystal sublayer 1101 to the semiconductor sublayer 1103 of the surface-emitting laser 1100 according to Japanese Patent Laid-Open No. 2006-165255 is expressed by the following equation 3.

$$R_{1100} = \rho_{101} \times (t_{1101}/(1-ff)) + \rho_{1102} \times t_{1102} + \rho_{1103} \times t_{1103} \quad \text{Equation 3}$$

In the equation 3, $t_{1101}$ denotes the thickness of the two-dimensional photonic crystal sublayer 1101, $\rho_{1102}$ denotes the resistivity of the p-type cladding sublayer 1102, $t_{1102}$ denotes the thickness of the p-type cladding sublayer 1102, $\rho_{1103}$ denotes the resistivity of the semiconductor sublayer 1103, and $t_{1103}$ denotes the thickness of the semiconductor sublayer 1103.

When parameters of a structure according to Example 1 are substituted into the equation 2, and parameters of a structure according to Comparative Example 1 are substituted into the equation 3, $t_{103}$ satisfying $R_{100} = R_{1100}$ is given by $t_{103} \cong 3.65 \times (\lambda/n_{\text{eff}})$. $\rho_{1102}$ denotes the resistivity of p-type AlGaN. Although $\rho_{1102}$ depends on the Al content, $\rho_{1102}$ is assumed to be twice the resistivity of p-type GaN in this calculation.

The thickness $t_{103}$ satisfying $R_{100} = R_{1100}$ depends on the wafer structures (the thicknesses and compositions of layers) of the surface-emitting laser 100 and the surface-emitting laser 1100. However, in consideration of the laser structure determined on the basis of the optical properties, the surface-emitting laser 100 and the surface-emitting laser 1100 have substantially the same structure as the surface-emitting laser according to Example 1.

The thickness $t_{PhC}$ of the two-dimensional photonic crystal sublayer 103 will be discussed below in terms of the difficulty with which the low-refractive-index medium 102 is formed. A large $t_{PhC}$ indicates a large aspect ratio of the cross-sectional shape of the low-refractive-index medium 102. For two-dimensional photonic crystals composed of a high-refractive-index medium 101 of GaN and a low-refractive-index medium 102 of air cylinders (the diameter d=56 nm=$0.35 \times (\lambda/n_{\text{eff}})$), the formation of the air cylinders (fine holes) by dry etching requires advanced technology. In particular, dry etching of vertical fine holes with high precision requires more advanced technology. The height $t_{PhC} = 3.65 \times (\lambda/n_{\text{eff}})$ described above corresponds to approximately 580 nm, and the aspect ratio is more than 10 at a diameter d=56 nm=$0.35 \times (\lambda/n_{\text{eff}})$. The formation of such a fine structure with nitride semiconductor requires advanced technology, and it is difficult to form a structure having an aspect ratio above 10.

Thus, also taking such difficulty into consideration, it is desirable that the thickness of the two-dimensional photonic crystal sublayer 103 be $t_{PhC} \leq 3.5 \times (\lambda/n_{\text{eff}})$.

Material and Thickness of Semiconductor Layer

The semiconductor sublayer 106 in the present embodiment also serves as a planarization layer for the formation of the p-electrode 105. The semiconductor sublayer 106 also functions as a layer for regulating light leakage to the p-electrode 105.

In a nitride semiconductor laser, in consideration of the contact resistance between the semiconductor sublayer 106 and the p-electrode 105, the semiconductor sublayer 106 is formed of p-type conductive $\text{In}_y\text{Ga}_{1-y}\text{N}$ ($0 \leq y \leq 1$), for example. It is desirable that the In content in $\text{In}_x\text{Ga}_{1-x}\text{N}$ ($0 \leq x \leq 1$) be determined such that light produced in the well sublayer 112 is not absorbed by the semiconductor sublayer 106. For example, the In content is determined such that the band gap of the semiconductor sublayer 106 is at least 5% larger than the band gap of the well sublayer 112.

It is desirable that the thickness $t_{semi}$ of the semiconductor sublayer 106 functioning as a layer for regulating light leakage to the p-electrode 105 satisfy the relation of $0.25 \times (\lambda/n_{\text{eff}}) \leq t_{semi} \leq 1.25 \times (\lambda/n_{\text{eff}})$. This thickness range will be discussed below.

Figure 4A:
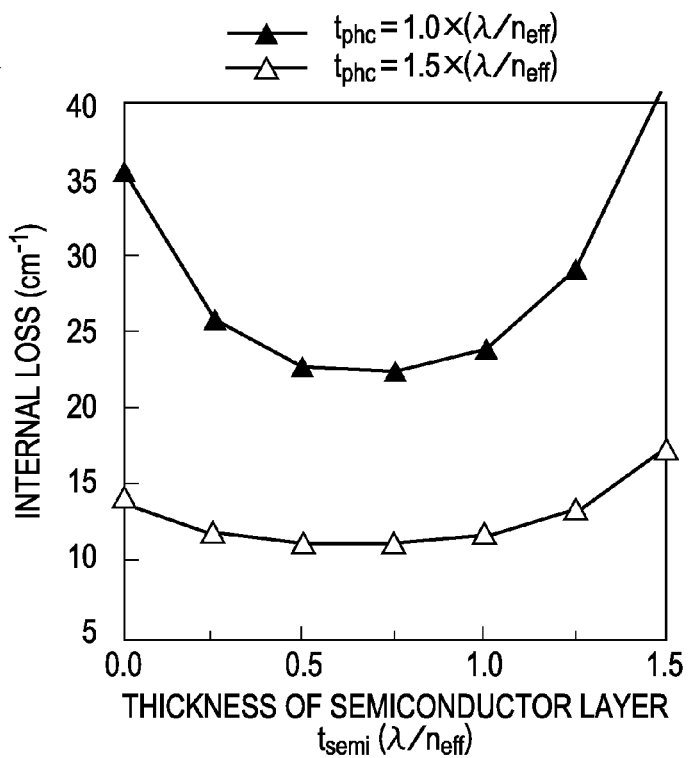
FIGS. 4A and 4B are graphs showing the relationship between the internal loss and the thickness $t_{semi}$ of a semiconductor layer according to an embodiment of the present invention.
Figure 4B:
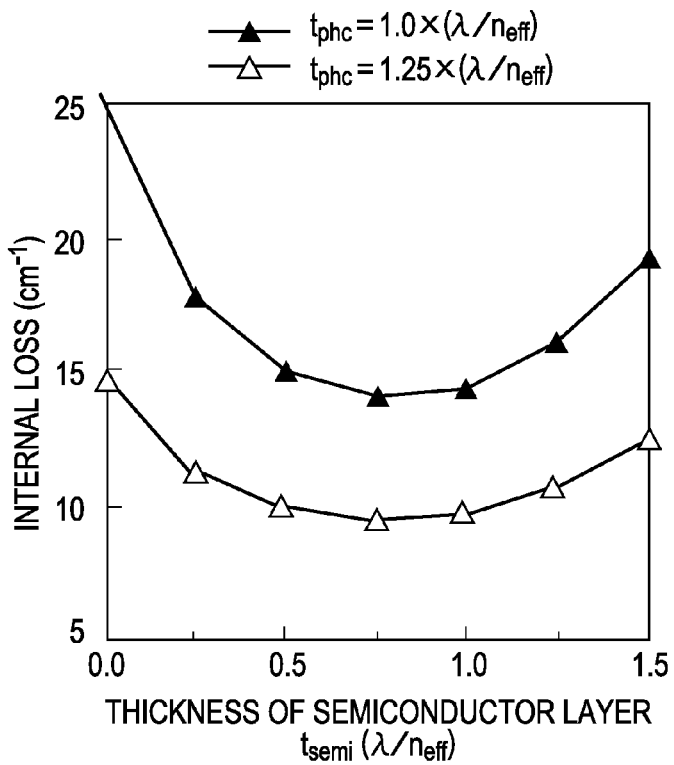

FIGS. 4A and 4B show the relationship between the internal loss (the sum of absorption in the p-electrode 105 and absorption in the p-type conductive layer 111) and the thickness $t_{semi}$ of the semiconductor sublayer 106.

FIG. 4A shows the results for a structure according to Example 1 described below at a lasing wavelength $\lambda$ of 400 nm. The thickness $t_{PhC}$ of the two-dimensional photonic crystal sublayer 103 is $1.0 \times (\lambda/n_{\text{eff}})$ or $1.5 \times (\lambda/n_{\text{eff}})$.

FIG. 4B shows the results for a structure according to Example 3 described below at a lasing wavelength $\lambda$ of 450 nm. The thickness $t_{PhC}$ of the two-dimensional photonic crystal sublayer 103 is $1.0 \times (\lambda/n_{\text{eff}})$ or $1.25 \times (\lambda/n_{\text{eff}})$.

FIGS. 4A and 4B show that the thickness $t_{semi}$ of the semiconductor sublayer 106 has an optimum range to reduce the internal loss. This phenomenon will be qualitatively described below.

An excessively small thickness of the semiconductor sublayer 106 results in an excessively short distance between the well sublayer 112 and the p-electrode 105. This increases light leakage to the p-electrode 105 and the absorption loss. An appropriate thickness of the semiconductor sublayer 106 allows the well sublayer 112 and the p-electrode 105 to be separated appropriately, thus reducing the absorption loss in the p-electrode 105.

However, an excessively large thickness of the semiconductor sublayer 106 results in an increase in the average refractive index of the p-electrode 105. This increases light leakage to the p-electrode 105 and the absorption loss. In addition, the resulting increase in the thickness of the p-type conductive layer 111 results in an increase in the absorption in the p-type conductive layer 111.

Thus, the semiconductor sublayer 106 has an optimum thickness range. More specifically, the thickness $t_{semi}$ of the semiconductor sublayer 106 can satisfy the relation of $0.25 \times (\lambda/n_{\text{eff}}) \leq t_{semi} \leq 1.25 \times (\lambda/n_{\text{eff}})$.

FIGS. 4A and 4B also show that the thickness $t_{semi}$ of the semiconductor sublayer 106 giving the minimum internal loss is in the range of $0.25\times(\lambda/n_{eff})\leq t_{semi}\leq 1.25\times(\lambda/n_{eff})$ for different thicknesses $t_{PhC}$ of the two-dimensional photonic crystal sublayer 103.

Figure 5:
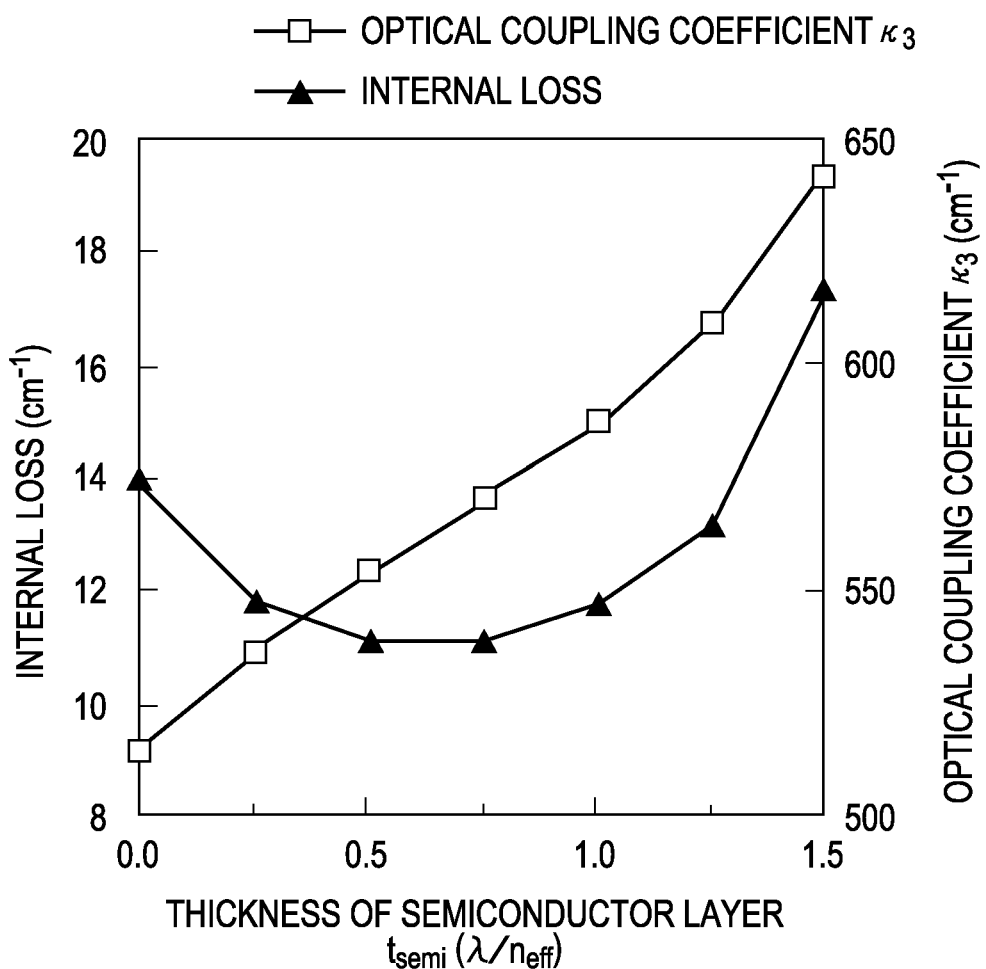
FIG. 5 is a graph showing the internal loss and the optical coupling coefficient $\kappa_3$ as a function of the thickness $t_{semi}$ of a semiconductor layer according to an embodiment of the present invention.

FIG. 5 is a graph showing the optical coupling coefficient $\kappa_3$ of photonic crystals as a function of the thickness $t_{semi}$ of the semiconductor sublayer 106, as well as the internal loss at a lasing wavelength of 400 nm and a thickness $t_{PhC}$ of the two-dimensional photonic crystal sublayer 103 of $1.0\times(\lambda/n_{eff})$ shown in FIG. 4A.

The optical coupling coefficient $\kappa_3$ indicates the magnitude of in-plane second-order diffraction (a feedback effect) of the two-dimensional photonic crystal sublayer 103. The optical coupling coefficient $\kappa_3$ can be treated in the same way as the mirror reflectivity of an edge-emitting laser. Thus, the coupling coefficient $\kappa_3$ must be optimized for the internal loss to develop an optimum laser device.

As described above, the internal loss is small in the range of $0.25\times(\lambda/n_{eff})\leq t_{semi}\leq 1.25\times(\lambda/n_{eff})$ in FIG. 5. The optical coupling coefficient $\kappa_3$ increases monotonously with the thickness $t_{semi}$ of the semiconductor sublayer 106. Thus, at a thickness $t_{semi}$ of the semiconductor sublayer 106 in the range of $0.25\times(\lambda/n_{eff})\leq t_{semi}\leq 1.25\times(\lambda/n_{eff})$, the optical coupling coefficient $\kappa_3$ can be appropriately controlled while the internal loss is maintained low. This is very advantageous to the optimization of laser characteristics.

Active Layer

The active layer 104 has a double heterostructure composed of the well sublayer 112 and the barrier sublayer 113. Although the active layer 104 of the surface-emitting laser 100 illustrated in FIG. 1 has a single-quantum-well structure including one well sublayer 112, the active layer 104 may have a multiple-quantum-well structure composed of a plurality of well sublayers 112 and barrier sublayers 113.

The media of the active layer 104 are nitride semiconductors containing Ga, N, In, and/or Al. For example, a well sublayer 112 having an emission band at a wavelength in the vicinity of 400 nm is formed of InGaN and contains 7% to 10% In. In this case, the barrier sublayer 113 is formed of GaN or InGaN and contains 0% to 3% In. For example, a well sublayer 112 having an emission band at a wavelength in the vicinity of 450 nm is formed of InGaN and contains 15% to 25% In. In this case, the barrier sublayer 113 is formed of GaN or InGaN and contains 0% to 10% In.

A small distance $d_g$ between the active layer 104 and the two-dimensional photonic crystal sublayer 103 results in an increase in light intensity distribution in the p-type conductive layer 111, causing absorption loss. It is therefore desirable that a guide layer formed of an intrinsic semiconductor be disposed between the active layer 104 and the minority carrier blocking sublayer 109 to increase the distance $d_g$ between the active layer 104 and the two-dimensional photonic crystal sublayer 103.

Although an increase in $d_g$ results in a decrease in absorption loss in the p-type conductive layer 111, an increase in $d_g$ results in a decrease in light intensity distribution in the two-dimensional photonic crystal sublayer 103, thus decreasing the optical coupling coefficient $\kappa_3$.

Thus, it is desirable that the distance $d_g$ between the active layer 104 and the two-dimensional photonic crystal sublayer 103 be set in a certain range to increase the optical coupling coefficient $\kappa_3$ while the absorption loss is maintained low.

For example, it is desirable that the distance $d_g$ satisfy the relation of $0.25\times(\lambda/n_{eff})\leq d_g\leq 1.25\times(\lambda/n_{eff})$.

The guide layer disposed between the active layer 104 and the minority carrier blocking sublayer 109 is formed of AlGaN, GaN, or InGaN. For a guide layer formed of InGaN, it is desirable that the In content in the guide layer be determined such that light produced in the well sublayer 112 is not absorbed by the guide layer. For example, the In content is determined such that the band gap of the guide layer is at least 5% larger than the band gap of the well sublayer 112.

N-Type Cladding Layer

The present invention is advantageous when light produced in the well sublayer 112 leaks in large amounts to the p-type conductive layer 111. Thus, it is desirable that the refractive index of the n-type cladding layer 108 be equal to or lower than the refractive index of an n-type cladding layer of general edge-emitting lasers formed of a nitride semiconductor. For a surface-emitting laser 100 having a lasing wavelength of 400 nm, it is desirable that the n-type cladding layer 108 be formed of AlGaN and that the Al content range from 5% to 13%. For a surface-emitting laser 100 having a lasing wavelength of 450 nm, it is desirable that the Al content in n-type AlGaN range from 0% to 8%.

Electrode

The n-electrode 110 and the p-electrode 105 are formed of an alloy containing any of Au, Ni, Cu, Pt, Pd, Al, Ti, and Hf. In the case that the n-electrode 110 or the p-electrode 105 is transparent, the n-electrode 110 or the p-electrode 105 is formed of indium tin oxide (ITO), indium zinc oxide (IZO), or zinc oxide (ZnO).

Another Embodiment

Edge-Emitting Laser

The semiconductor laser described in the first embodiment is characterized in that the two-dimensional photonic crystal sublayer 103 having a low average refractive index is used as a p-side cladding layer instead of the p-type cladding sublayer 1102 formed of high-resistance p-type AlGaN. This approach can be applied to not only DFB surface-emitting lasers, but also one-dimensional edge-emitting lasers.

Figure 6A:
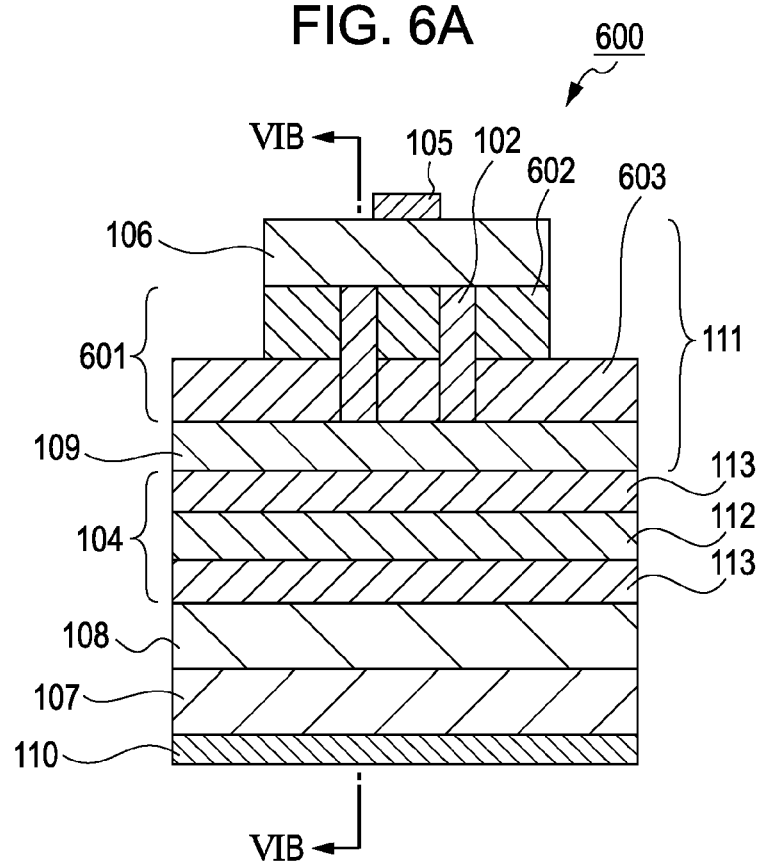
FIGS. 6A and 6B are cross-sectional views of an edge-emitting laser according to an embodiment of the present invention.
Figure 6B:
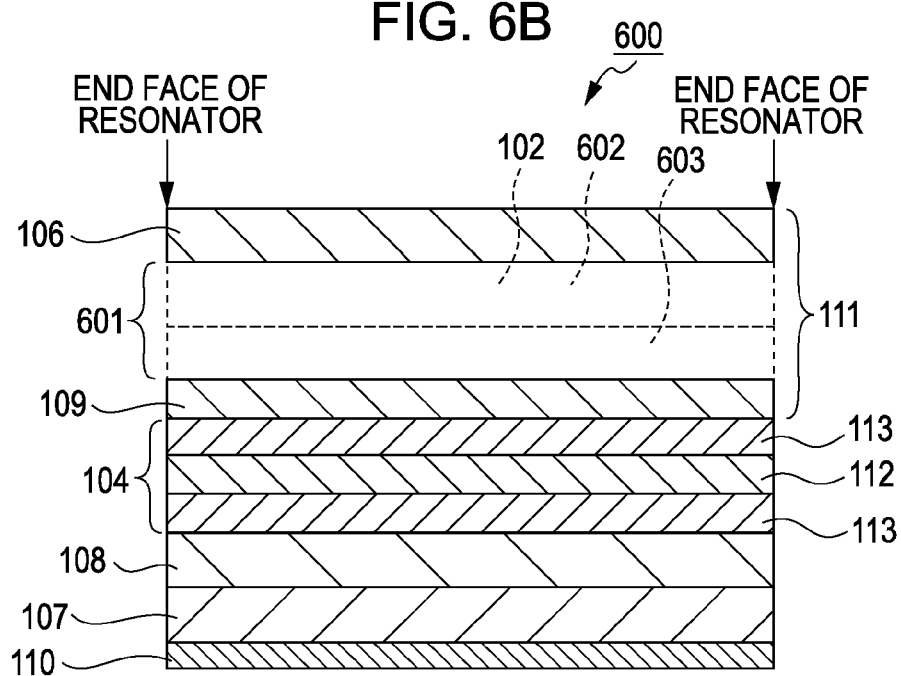

FIGS. 6A and 6B are cross-sectional views of an edge-emitting laser 600 formed of a nitride semiconductor according to an embodiment of the present invention. FIG. 6A illustrates a cross-section parallel to an end face, and FIG. 6B is a cross-sectional view taken along the line VIB-VIB of FIG. 6A. The edge-emitting laser 600 includes a low-refractive-index-medium-embedded sublayer 601 between a minority carrier blocking sublayer 109 and a semiconductor sublayer 106. The low-refractive-index-medium-embedded sublayer 601 includes a plurality of low-refractive-index media 102. The low-refractive-index-medium-embedded sublayer 601 is formed of p-type conductive $In_xGa_{1-x}N$ ($0\leq x\leq 1$).

The low-refractive-index-medium-embedded sublayer 601 has the following three functions.

A first function is optical confinement in a direction perpendicular to a substrate. Light produced in a well sublayer 112 is confined by an n-type cladding layer 108 and the low-refractive-index-medium-embedded sublayer 601.

A second function is optical confinement in the transverse direction. In the edge-emitting laser 600 illustrated in FIG. 6A, the semiconductor sublayer 106 and a first low-refractive-index-medium-embedded sublayer 602 control the transverse mode. The first low-refractive-index-medium-embedded sublayer 602 and a second low-refractive-index-medium-embedded sublayer 603 may be formed of different materials.

A third function is control of a positive hole injection region, that is, current confinement. In the edge-emitting laser 600 in FIG. 6, positive holes injected from a p-electrode 105 flows into an active layer 104 through the low-refractive-index-medium-embedded sublayer 601. Positive holes flows predominantly through a region surrounded by the low-refractive-index medium 102 directly under the p-electrode 105. Light in the resonant mode is predominantly distributed in the active layer 104 in a region between two low-refractive-index media 102, that is, directly under the p-electrode 105. Thus, the light intensity distribution in the resonant mode can be coincide with the current injection region, thereby amplifying light efficiently. Furthermore, the absence of high-resistance p-type AlGaN can reduce the electrical resistance.

EXAMPLE 1

Lasing Wavelength: 400 nm

Table 1 shows the wafer structure of a surface-emitting laser according to Example 1.

These guide layers 702, together with a guide layer 703 described below, can increase the average refractive index of the neighborhood of an active layer 104. Even in media having a small refractive index difference, such as nitride semiconductors, therefore, the guide layers 702 and the guide layer 703 allow effective optical confinement in the lamination direction, enhancing the formation of a resonant mode.

The active layer 104 was then formed on the undoped GaN guide layer 702. The active layer 104 had a three-layer quantum well structure composed of three $In_{0.09}Ga_{0.91}N$ well sublayers 112 each having a thickness of 2.5 nm and two GaN barrier sublayers 113 each having a thickness of 7.5 nm. The active layer 104 produced light having a wavelength around 400 nm.

An undoped GaN guide layer 703 having a thickness of 80 nm was formed on the active layer 104. The guide layer 703 was adjacent to the active layer 104 and had a large light intensity distribution. A guide layer 703 formed of a p-type conductive medium will have considerable absorption loss resulting from a Mg dopant. Thus, the guide layer 703 is desirably formed of an intrinsic semiconductor and was formed of undoped GaN in the present example.

As a minority carrier blocking sublayer 109, a p-type $Al_{0.18}Ga_{0.82}N$ layer having a thickness of 20 nm and a p-type

TABLE 1

| Medium | Thickness (mm) | Designation | |
|---|---|---|---|
| Au | 0.04 | P-electrode 105 | |
| Ni | 0.01 | P-electrode 105 | |
| p-GaN | 0.08 | Semiconductor layer 106 | |
| p-GaN/Air | 0.24 | Two-dimensional photonic crystal sublayer 103 | |
| p-GaN | 0.02 | Guide layer 704 | P-type conductive layer 111 |
| p-$Al_{0.18}Ga_{0.82}N$ | 0.02 | Minority carrier blocking sublayer 109 | |
| ud-GaN | 0.08 | Guide layer 703 | |
| $In_{0.09}Ga_{0.91}N$ | 0.0025 | Well sublayer 112 | |
| GaN | 0.0075 | Barrier sublayer 113 | |
| $In_{0.09}Ga_{0.91}N$ | 0.0025 | Well sublayer 112 | Active layer 104 |
| GaN | 0.0075 | Barrier sublayer 113 | |
| $In_{0.09}Ga_{0.91}N$ | 0.0025 | Well sublayer 112 | |
| ud-GaN | 0.03 | Guide layer 702 | |
| n-GaN | 0.05 | Guide layer 702 | |
| n-$Al_{0.11}Ga_{0.89}N$ | 0.6 | N-type cladding layer 108 | |
| n-GaN | 1.0 | Buffer layer 701 | |
| n-GaN | 100 | N-type substrate 107 | |
| Ti | 0.03 | N-electrode 110 | |
| Al | 0.1 | N-electrode 110 | |

Nitride semiconductor layers described below were sequentially formed on an n-type GaN substrate 107 by metal-organic vapor phase epitaxy (MOVPE).

First, an n-type $Al_{0.11}Ga_{0.89}N$ cladding layer 108 having a thickness of 600 nm was formed on an n-type GaN buffer layer 701 having a thickness of 1 μm.

An n-type GaN guide layer 702 having a thickness of 50 nm and an undoped GaN guide layer 702 having a thickness of 30 nm were subsequently formed on the n-type cladding layer 108.

GaN layer having a thickness of 260 nm were formed on the guide layer 703. The crystal growth by metal-organic chemical vapor deposition (MOCVD) was temporarily stopped, and a two-dimensional photonic crystal sublayer 103 was subsequently formed.

A two-dimensional photonic crystal pattern was formed by semiconductor lithography and dry etching. A high-refractive-index medium 101 of the two-dimensional photonic crystals was p-type GaN, and a low-refractive-index medium 102 was air. Holes formed by dry etching served as the low-refractive-index medium 102. The depth of the holes corresponded to the thickness of the two-dimensional photonic crystal sublayer 103. Holes having a depth of 240 nm were formed by dry etching. Thus, a p-type GaN guide layer 704 having a thickness of 20 nm and the two-dimensional photonic crystal sublayer 103 formed of p-type GaN and air having a thickness of 240 nm were formed on the minority carrier blocking sublayer 109.

The thickness of 240 nm of the two-dimensional photonic crystal sublayer 103 corresponds to approximately $1.5 \times (\lambda/n_{eff})$. The distance from the active layer 104 to the two-dimensional photonic crystal sublayer 103 corresponds to approximately $0.75 \times (\lambda/n_{eff})$. The cylindrical holes filled with the low-refractive-index medium 102 (air) were arranged in a tetragonal lattice. The interval of the cylindrical air holes was 160 nm, and the diameter of the cylindrical air holes was 56 nm. The two-dimensional photonic crystal sublayer 103 had a resonant mode at a wavelength of approximately 400 nm.

The two-dimensional photonic crystal sublayer 103 was regrown by MOCVD while the air holes of two-dimensional photonic crystals were left, forming a p-type GaN semiconductor sublayer 106 having a thickness of 80 nm. Since the air holes in the two-dimensional photonic crystal sublayer 103 had a diameter of 56 nm, the p-type GaN semiconductor sublayer 106 having a thickness of 80 nm was sufficient to close the air holes. The thickness of 80 nm of the semiconductor sublayer 106 corresponds to approximately $0.5 \times (\lambda/n_{eff})$.

The n-type GaN substrate 107 and the p-type GaN semiconductor sublayer 106 were provided with an electrode into which carriers can be injected. N-electrodes 110 were formed of Ti and Al, and p-electrodes 105 were formed of Au and Ni.

COMPARATIVE EXAMPLE 1

Table 2 shows the wafer structure of a surface-emitting laser according to Comparative Example 1. The surface-emitting laser according to Comparative Example 1 was compared with the surface-emitting laser according to Example 1. The surface-emitting laser according to Comparative Example 1 included a p-type AlGaN cladding sublayer and had a lasing wavelength of 400 nm.

TABLE 2

| Medium | Thickness (mm) | Designation | |
|---|---|---|---|
| Au | 0.04 | P-electrode 105 | |
| Ni | 0.01 | P-electrode 105 | |
| p-GaN | 0.08 | Semiconductor layer 1103 | |
| p-Al$_{0.09}$Ga$_{0.91}$N | 0.28 | P-type cladding sublayer 1102 | |
| p-GaN/Air | 0.08 | Two-dimensional photonic crystal sublayer 1101 | P-type conductive layer 111 |
| p-GaN | 0.02 | Guide layer 704 | |
| p-Al$_{0.18}$Ga$_{0.82}$N | 0.02 | Minority carrier blocking sublayer 109 | |
| ud-GaN | 0.08 | Guide layer 703 | |
| In$_{0.09}$Ga$_{0.91}$N | 0.0025 | Well sublayer 112 | |
| GaN | 0.0075 | Barrier sublayer 113 | |
| In$_{0.09}$Ga$_{0.91}$N | 0.0025 | Well sublayer 112 | Active layer 104 |
| GaN | 0.0075 | Barrier sublayer 113 | |
| In$_{0.09}$Ga$_{0.91}$N | 0.0025 | Well sublayer 112 | |
| ud-GaN | 0.03 | Guide layer 702 | |
| n-GaN | 0.05 | Guide layer 702 | |
| n-Al$_{0.11}$Ga$_{0.89}$N | 0.6 | N-type cladding layer 108 | |
| n-GaN | 1.0 | Buffer layer 701 | |
| n-GaN | 100 | N-type substrate 107 | |
| Ti | 0.03 | N-electrode 110 | |
| Al | 0.1 | N-electrode 110 | |

As compared with the wafer structure according to Example 1 shown in Table 1, there are two differences.

A first difference is the thickness of a two-dimensional photonic crystal sublayer. The thicknesses of a two-dimensional photonic crystal sublayer were 240 nm in Example 1 and 80 nm in Comparative Example 1. The thickness of 80 nm corresponds to approximately $0.5 \times (\lambda/n_{eff})$.

A second difference is the presence of a p-type Al$_{0.09}$Ga$_{0.91}$N cladding sublayer 1102 having a thickness of 280 nm between a two-dimensional photonic crystal sublayer 1101 and a p-type GaN semiconductor sublayer 1103 having a thickness of 80 nm. The p-type Al$_{0.09}$Ga$_{0.91}$N cladding sublayer 1102 in Comparative Example 1 was not formed in Example 1.

Table 3 shows the internal loss (the sum of absorption in the p-electrode 105 and absorption in the p-type conductive layer 111), the electrical resistance ratio, the optical coupling coefficient $\kappa_3$, and the optical confinement factor of a well sublayer 112 of the surface-emitting laser according to Example 1 in comparison with Comparative Example 1. The electrical resistance ratio is the ratio of the electrical resistance per unit area from the two-dimensional photonic crystal sublayer 103 to the semiconductor sublayer 106 in Example 1 to the electrical resistance per unit area from the two-dimensional photonic crystal sublayer 1101 to the semiconductor sublayer 1103 in Comparative Example 1.

TABLE 3

| | Example 1 | Comparative Example 1 |
|---|---|---|
| Internal loss | 11.2 cm$^{-1}$ | 12.5 cm$^{-1}$ |
| Electrical resistance ratio | 0.48 | 1.0 |
| Optical coupling coefficient $\kappa_3$ | 555 cm$^{-1}$ | 508 cm$^{-1}$ |

TABLE 3-continued

|  | Example 1 | Comparative Example 1 |
|---|---|---|
| Optical confinement factor of well sublayer | 3.4% | 3.3% |

There is no significant difference in internal loss between Example 1 and Comparative Example 1. However, the electrical resistance in Example 1 is approximately half of the electrical resistance in Comparative Example 1. This indicates that high electrical resistance due to p-type AlGaN may be reduced. A decrease in electrical resistance can result in reduced heat generation and thereby a lower lasing threshold.

Although the optical confinement factors of the well sublayer 112 were almost the same, the optical coupling coefficient $\kappa_3$ in Example 1 was approximately 10% higher than the optical coupling coefficient $\kappa_3$ in Comparative Example 1. The optical coupling coefficient $\kappa_3$ is proportional to the intensity of light confined in the two-dimensional photonic crystal sublayer 103. Thus, there is a trade-off between the optical coupling coefficient $\kappa_3$ and the absorption loss in the p-electrode 105.

When the structure according to Example 1 shown in Table 1 is modified such that the optical coupling coefficient $\kappa_3$ in Example 1 is comparable to the optical coupling coefficient $\kappa_3$ in Comparative Example 1, the internal loss can be smaller in Example 1 than in Comparative Example 1. Thus, the surface-emitting laser according to Example 1 shown in Table 1 can reduce the internal loss and the electrical resistance without altering the characteristics of the two-dimensional photonic crystal sublayer 103 serving as a resonator.

EXAMPLE 2

Lasing Wavelength: 450 nm

Table 4 shows the wafer structure of a surface-emitting laser according to Example 2 of the present invention.

TABLE 4

| Medium | Thickness (mm) | Designation | |
|---|---|---|---|
| Au | 0.04 | P-electrode 105 | |
| Ni | 0.01 | P-electrode 105 | |
| p-In$_{0.02}$Ga$_{0.98}$N | 0.032 | Semiconductor layer 106 | |
| p-In$_{0.02}$Ga$_{0.98}$N/Air | 0.23 | Two-dimensional photonic crystal sublayer 103 | |
| p-In$_{0.02}$Ga$_{0.98}$N | 0.02 | Guide layer 704 | P-type conductive layer 111 |
| p-Al$_{0.18}$Ga$_{0.82}$N | 0.02 | Minority carrier blocking sublayer 109 | |
| ud-In$_{0.02}$Ga$_{0.98}$N | 0.1 | Guide layer 703 | |
| In$_{0.18}$Ga$_{0.82}$N | 0.0025 | Well sublayer 112 | |
| In$_{0.02}$Ga$_{0.98}$N | 0.0075 | Barrier sublayer 113 | |
| In$_{0.18}$Ga$_{0.82}$N | 0.0025 | Well sublayer 112 | Active layer 104 |
| In$_{0.02}$Ga$_{0.98}$N | 0.0075 | Barrier sublayer 113 | |
| In$_{0.18}$Ga$_{0.82}$N | 0.0025 | Well sublayer 112 | |
| ud-In$_{0.02}$Ga$_{0.98}$N | 0.006 | Guide layer 702 | |
| n-Al$_{0.06}$Ga$_{0.94}$N | 0.9 | N-type cladding layer 108 | |
| n-Gan | 1.0 | Buffer layer 701 | |
| n-Gan | 100 | N-type substrate 107 | |
| Ti | 0.03 | N-electrode 110 | |
| Al | 0.1 | N-electrode 110 | |

The surface-emitting laser according to Example 2 had a lasing wavelength around 450 nm. A well sublayer 112 of an active layer 104 was formed of In$_{0.18}$Ga$_{0.82}$N, and a barrier layer 113 was formed of In$_{0.02}$Ga$_{0.98}$N. The medium In$_{0.18}$Ga$_{0.82}$N of the well sublayer 112 can have a lattice constant close to the lattice constant of the medium of a cladding layer or a guide layer to achieve high crystal quality. However, selection of the media to cause a difference in refractive index between the active layer and the cladding layer and to form a resonant mode inevitability increases the difference in these lattice constants. In particular, it is difficult to increase the refractive index difference using nitride semiconductors at a wavelength of 450 nm. The medium of each layer must be determined in comprehensive consideration of these things.

In Example 2, an n-type AlGaN cladding layer 108 contained 6% Al and had a thickness of 0.9 μm. A guide layer 702 formed on the n-type cladding layer 108 was formed of In$_{0.02}$Ga$_{0.98}$N and had a thickness of 60 nm. This structure allows the formation of a resonant mode and the reduction in the internal strain of the well sublayer 112, achieving high crystal quality.

Undoped In$_{0.02}$Ga$_{0.98}$N was grown on the active layer 104 to form a guide layer 703 having a thickness of 100 nm. A p-type Al$_{0.18}$Ga$_{0.82}$N minority carrier blocking sublayer 109 having a thickness of 20 nm was formed on the guide layer 703.

P-type In$_{0.02}$Ga$_{0.98}$N was grown to a thickness of 250 nm to form a two-dimensional photonic crystal sublayer 103. As in Example 1, air holes having a depth of 230 nm were formed by semiconductor lithography and dry etching. Thus, a p-type In$_{0.02}$Ga$_{0.98}$N guide layer 704 having a thickness of 20 nm and the two-dimensional photonic crystal sublayer 103 formed of p-type In$_{0.02}$Ga$_{0.98}$N and air having a thickness of 230 nm were formed on the minority carrier blocking sublayer 109. The thickness of 230 nm of the two-dimensional photonic crystal sublayer 103 corresponds to approximately $1.25 \times (\lambda/n_{\mathit{eff}})$. The distance from the active layer 104 to the two-dimensional photonic crystal sublayer 103 corresponds to approximately $0.76 \times (\lambda/n_{\mathit{eff}})$. The cylindrical holes filled with the low-refractive-index medium 102 (air) were arranged in a tetragonal lattice. The interval of the cylindrical air holes was 184 nm, and the diameter of the cylindrical air holes was 64 nm. The two-dimensional photonic crystal sublayer 103 had a resonant mode at a wavelength of approximately 450 nm.

P-type $In_{0.02}Ga_{0.98}N$ was grown to a thickness of 32 nm to form a semiconductor sublayer 106 on the two-dimensional photonic crystal sublayer 103. The thickness of 32 nm corresponds to approximately $0.17\times(\lambda/n_{eff})$.

As electrodes into which carriers can be injected, n-electrodes 110 were formed of Ti and Al, and p-electrodes 105 were formed of Au and Ni, as in Example 1.

COMPARATIVE EXAMPLE 2

Table 5 shows the wafer structure of a surface-emitting laser according to Comparative Example 2. The surface-emitting laser according to Comparative Example 2 was compared with the surface-emitting laser according to Example 2. The surface-emitting laser according to Comparative Example 2 included a p-type AlGaN cladding sublayer and had a lasing wavelength of 450 nm.

TABLE 5

| Medium | Thickness (mm) | Designation | |
|---|---|---|---|
| Au | 0.04 | P-electrode 105 | |
| Ni | 0.01 | P-electrode 105 | |
| p-$In_{0.02}Ga_{0.98}N$ | 0.032 | Semiconductor layer 1103 | |
| p-$Al_{0.04}Ga_{0.96}N$ | 0.46 | P-typCe cladding sublayer 1102 | |
| p-$In_{0.02}Ga_{0.98}N$/Air | 0.064 | Two-dimensional photonic crystal sublayer 1101 | P-type conductive layer 111 |
| p-$In_{0.02}Ga_{0.98}N$ | 0.02 | Guide layer 704 | |
| p-$Al_{0.18}Ga_{0.82}N$ | 0.02 | Minority carrier blocking sublayer 109 | |
| ud-$In_{0.02}Ga_{0.98}N$ | 0.1 | Guide layer 703 | |
| $In_{0.18}Ga_{0.82}N$ | 0.0025 | Well sublayer 112 | |
| $In_{0.02}Ga_{0.98}N$ | 0.0075 | Barrier sublayer 113 | |
| $In_{0.18}Ga_{0.82}N$ | 0.0025 | Well sublayer 112 | Active layer 104 |
| $In_{0.02}Ga_{0.98}N$ | 0.0075 | Barrier sublayer 113 | |
| $In_{0.18}Ga_{0.82}N$ | 0.0025 | Well sublayer 112 | |
| ud-$In_{0.02}Ga_{0.98}N$ | 0.06 | Guide layer 702 | |
| n-$Al_{0.06}Ga_{0.94}N$ | 0.9 | N-type cladding layer 108 | |
| n-GaN | 1.0 | Buffer layer 701 | |
| n-GaN | 100 | N-type substrate 107 | |
| Ti | 0.03 | N-electrode 110 | |
| Al | 0.1 | N-electrode 110 | |

As compared with the wafer structure according to Example 2 shown in Table 4, there are two differences.

A first difference is the thickness of a two-dimensional photonic crystal sublayer. The thicknesses of a two-dimensional photonic crystal sublayer were 230 nm in Example 2 and 64 nm in Comparative Example 2. The thickness of 64 nm corresponds to approximately $0.35\times(\lambda/n_{eff})$.

A second difference is the presence of a p-type $Al_{0.04}Ga_{0.96}N$ cladding sublayer 1102 having a thickness of 460 nm between a two-dimensional photonic crystal sublayer 1101 and a p-type GaN semiconductor sublayer 1103 having a thickness of 80 nm. The p-type $Al_{0.04}Ga_{0.96}N$ cladding sublayer 1102 in Comparative Example 2 was not formed in Example 2.

Table 6 shows the internal loss, the electrical resistance ratio, the optical coupling coefficient $\kappa_3$, and the optical confinement factor of a well sublayer 112 of the surface-emitting laser according to Example 2 in comparison with Comparative Example 2. As described in Example 1, the electrical resistance ratio is the ratio of the electrical resistance per unit area from the two-dimensional photonic crystal sublayer to the semiconductor sublayer in Example 2 to that in Comparative Example 2.

TABLE 6

| | Example 2 | Comparative Example 2 |
|---|---|---|
| Internal loss | 11.9 cm$^{-1}$ | 13.2 cm$^{-1}$ |
| Electrical resistance ratio | 0.39 | 1.0 |
| Optical coupling coefficient $\kappa_3$ | 365 cm$^{-1}$ | 373 cm$^{-1}$ |
| Optical confinement factor of well sublayer | 2.8% | 2.7% |

Although there is no significant difference in the internal loss, the optical coupling coefficient $\kappa_3$, and the optical confinement factor of a well sublayer 112 between Example 2 and Comparative Example 2, the electrical resistance in Example 2 is approximately 60% lower than the electrical resistance in Comparative Example 2. This allows the surface-emitting laser according to Example 2 to reduce heat generation and thereby decrease the lasing threshold. Thus, the surface-emitting laser according to Example 2 of the present invention can reduce the internal loss and the electrical resistance without altering the characteristics of the two-dimensional photonic crystal sublayer 103 serving as a resonator.

EXAMPLE 3

The effects of the thickness $t_{semi}$ of a semiconductor sublayer 106 are described with a surface-emitting laser according to Example 3. The structure of the surface-emitting laser according to Example 3 was the same as the wafer structure according to Example 2 shown in Table 4 except that the semiconductor sublayer 106 had a thickness of 138 nm. The thickness of the semiconductor sublayer 106 in Example 2 was 32 nm, corresponding to approximately $0.17\times(\lambda/n_{eff})$, whereas the thickness of the semiconductor sublayer 106 in Example 3 corresponded to approximately $0.75\times(\lambda/n_{eff})$.

In Example 3, the internal loss decreased to 9.6 cm$^{-1}$, and the optical coupling coefficient increased to 409 cm$^{-1}$. The electrical resistance ratio was approximately half of the electrical resistance ratio in Comparative Example 2. In general, when the p-type conductive layer 111 contains two-dimensional photonic crystals, an increase in optical coupling coefficient $\kappa_3$ results in an increase in absorption loss in the p-electrode 105, thus increasing the internal loss. However, the surface-emitting laser according to Example 3 can decrease the internal loss, increase the optical coupling coefficient $\kappa_3$, and reduce an increase in electrical resistance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-079399 filed Mar. 27, 2009, which is hereby incorporated by reference herein in its entirety.

What is claimed is:

1. A surface-emitting laser comprising:
an active layer; a two-dimensional photonic crystal layer having a resonant mode in an in-plane direction; a semiconductor layer; and an electrode in this order,
wherein the two-dimensional photonic crystal layer contains p-type conductive $In_xGa_{1-x}N$ ($0 \le x \le 1$) as a high-refractive-index medium,
the semiconductor layer contains p-type conductive $In_yGa_{1-y}N$ ($0 \le y \le 1$), and
the thickness $t_{PhC}$ of the two-dimensional photonic crystal layer satisfies the relation of $t_{PhC} \ge (\lambda/n_{eff})$, where $\lambda$ denotes a lasing wavelength, and $n_{eff}$ denotes an effective refractive index of the resonant mode; and
the thickness $t_{semi}$ of the semiconductor layer satisfies the relation of $0.25 \times (\lambda/n_{eff}) \le t_{semi} \le 1.25 \times (\lambda/n_{eff})$.

2. The surface-emitting laser according to claim 1, wherein the thickness $t_{PhC}$ of the two-dimensional photonic crystal layer satisfies the relation of $t_{PhC} \le 3.5 \times (\lambda/n_{eff})$.

3. The surface-emitting laser according to claim 1, wherein no p-type conductive AlGaN layer is disposed between the two-dimensional photonic crystal layer and the semiconductor layer.

4. The surface-emitting laser according to claim 1, wherein the two-dimensional photonic crystal layer and the semiconductor layer are in contact with each other.

* * * * *